(12) United States Patent
Endres

(10) Patent No.: US 9,754,695 B2
(45) Date of Patent: Sep. 5, 2017

(54) EUV COLLECTOR

(71) Applicant: Carl Zeiss SMT GmbH, Oberkochen (DE)

(72) Inventor: Martin Endres, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/665,279

(22) Filed: Mar. 23, 2015

(65) Prior Publication Data

US 2015/0194230 A1 Jul. 9, 2015

Related U.S. Application Data

(63) Continuation of application No. PCT/EP2013/072427, filed on Oct. 25, 2013.
(Continued)

(30) Foreign Application Priority Data

Nov. 9, 2012 (DE) .......... 10 2012 220 465

(51) Int. Cl.
*G02B 27/42* (2006.01)
*G21K 1/06* (2006.01)
(Continued)

(52) U.S. Cl.
CPC .......... *G21K 1/067* (2013.01); *G02B 19/0023* (2013.01); *G02B 19/0095* (2013.01);
(Continued)

(58) Field of Classification Search
CPC ............ G02B 19/0023; G02B 19/0095; G02B 27/4233; G02B 27/4277; G02B 5/09;
(Continued)

(56) References Cited

U.S. PATENT DOCUMENTS 7,075,712 B2   7/2006   Kinoshita et al.
7,075,713 B2   7/2006   Arenberg
(Continued)

FOREIGN PATENT DOCUMENTS

DE   10 2010 028 655 A1   11/2011
EP         1 469 349 A1   10/2004
(Continued)

OTHER PUBLICATIONS

German Office Action, with translation thereof, for DE Appl No. 10 2012 220 465.2, dated Jun. 7, 2013.
(Continued)

*Primary Examiner* — Wyatt Stoffa
(74) *Attorney, Agent, or Firm* — Fish & Richardson P.C.

(57) ABSTRACT

An EUV collector transfers EUV radiation from an EUV radiation source into an illumination far field. The collector has a normal mirror collector subunit including a mirror for normal incidence, and a grazing mirror collector subunit including a mirror for grazing incidence. The arrangement of the collector subunits is such that an intensity distribution of the EUV radiation over the far field results which is composed of an inner normal mirror intensity distribution, generated by reflection at least also at the normal mirror collector subunit, and of an outer grazing mirror intensity distribution, generated by reflection at least also at the grazing mirror collector subunit. The intensity distribution, at least over a section of the far field which is greater than 40% of the total far field, deviates by less than 20% from an average intensity in the section of the far field.

24 Claims, 12 Drawing Sheets

Related U.S. Application Data

(60) Provisional application No. 61/724,398, filed on Nov. 9, 2012.

(51) Int. Cl.
| | | |
|---|---|---|
| *G03F 7/20* | (2006.01) | |
| *G02B 19/00* | (2006.01) | |
| *H05G 2/00* | (2006.01) | |
| *G02B 5/09* | (2006.01) | |
| *G02B 5/18* | (2006.01) | |

(52) U.S. Cl.
CPC ..... *G02B 27/4233* (2013.01); *G02B 27/4277* (2013.01); *G03F 7/70175* (2013.01); *H05G 2/008* (2013.01); *G02B 5/09* (2013.01); *G02B 5/1838* (2013.01); *G02B 5/1861* (2013.01)

(58) Field of Classification Search
CPC .... G02B 5/1838; G02B 5/1861; G21K 1/067; H05G 2/008
See application file for complete search history.

(56) References Cited

U.S. PATENT DOCUMENTS

| | | | | |
|---|---|---|---|---|
| 7,501,641 | B2* | 3/2009 | Silverman | G03F 7/70175 250/396 R |
| 8,895,946 | B2* | 11/2014 | Ceglio | G21K 1/067 250/504 R |
| 2005/0195506 | A1 | 9/2005 | McGuire et al. | |
| 2005/0275818 | A1 | 12/2005 | Singer | |
| 2006/0120429 | A1 | 6/2006 | Murakami | |
| 2006/0176547 | A1* | 8/2006 | Sasian | G02B 17/0605 359/359 |
| 2008/0212327 | A1* | 9/2008 | Singer | G03F 7/70183 362/297 |
| 2008/0266650 | A1* | 10/2008 | Sasian | G02B 17/0605 359/351 |
| 2011/0043779 | A1* | 2/2011 | Zocchi | G03F 7/70166 355/67 |
| 2011/0168925 | A1* | 7/2011 | Ceglio | B82Y 10/00 250/504 R |
| 2011/0242515 | A1* | 10/2011 | Ceglio | G02B 5/0891 355/67 |
| 2011/0318694 | A1* | 12/2011 | Levesque | G03F 7/70166 430/319 |
| 2012/0050704 | A1* | 3/2012 | Levesque | G03F 7/70033 355/53 |
| 2012/0050706 | A1* | 3/2012 | Levesque | B82Y 10/00 355/55 |
| 2012/0050707 | A1* | 3/2012 | Levesque | G02B 5/085 355/55 |
| 2012/0050708 | A1* | 3/2012 | Levesque | G03F 7/70166 355/60 |
| 2012/0187314 | A1* | 7/2012 | Bert | A61N 5/103 250/492.3 |
| 2012/0281189 | A1* | 11/2012 | Grek | G03F 7/70166 355/30 |
| 2013/0027681 | A1 | 1/2013 | Mann et al. | |
| 2013/0207004 | A1* | 8/2013 | Ceglio | G21K 1/067 250/504 R |
| 2014/0043595 | A1* | 2/2014 | Ceglio | G02B 5/0891 355/71 |
| 2014/0152967 | A1* | 6/2014 | Ceglio | G21K 1/067 355/67 |
| 2014/0375974 | A1* | 12/2014 | Yakunin | G03F 7/70033 355/67 |
| 2015/0355555 | A1* | 12/2015 | Maul | G02B 5/09 355/71 |

FOREIGN PATENT DOCUMENTS

| | | |
|---|---|---|
| WO | WO 2006/021419 A2 | 3/2006 |
| WO | WO 2009/095220 A1 | 8/2009 |
| WO | WO 2011/138259 A1 | 11/2011 |
| WO | WO 2012/126867 A1 | 9/2012 |

OTHER PUBLICATIONS

International Search Report for corresponding PCT Appl No. PCT/EP2013/072427, dated Feb. 6, 2014.

Chinese office action, with English translation, for corresponding CN Appl No. 2013 8005 8294.7, dated Aug. 5, 2016.

Chinese office action, with English translation thereof, for corresponding CN application No. 2013 8005 8294.7, dated Apr. 10, 2017.

* cited by examiner

EUV COLLECTOR

CROSS-REFERENCE TO RELATED APPLICATIONS

The present application is a continuation of, and claims benefit under 35 USC 120 to, international application PCT/EP2013/072427, filed Oct. 25, 2013, which claims benefit under 35 USC 119 of German Application No. 10 2012 220 465.2, filed Nov. 9, 2012. International application PCT/EP2013/072427 also claims priority under 35 USC 119(e) to U.S. Provisional Application No. 61/724,398, filed Nov. 9, 2012. The contents of international application PCT/EP2013/072427 and German patent application DE 10 2012 220 465.2 are incorporated herein by reference.

The invention relates to a collector for transferring an emission from an EUV (extreme ultraviolet) radiation source into a principal focal spot. Furthermore, the invention relates to an illumination optical unit comprising such a collector, an illumination system comprising such an illumination optical unit, a projection exposure apparatus comprising such an illumination system, a method for producing a micro- or nanostructured component via such a projection exposure apparatus, and a component produced by the method.

Collectors of the type mentioned in the introduction are known from WO 2011/138259 A1, from U.S. Pat. Nos. 7,075,712 B2, from 7,501,641 B2, from US 2006/0176547 A1, from US 2006/0120429 A1, from U.S. Pat. No. 7,075,713 B2, from EP 1 469 349 A1, from US 2008/0266650 A1 and from WO 2009/095220 A1.

It is an object of the present invention to improve a collector such that requirements made of beam guiding for an illumination optical unit disposed downstream are reduced.

This object is achieved according to the invention via an EUV collector for transferring EUV radiation from an EUV radiation source into an illumination far field. The collector includes at least one normal incidence mirror collector subunit including at least one mirror for normal incidence which transfers the EUV radiation from the radiation source to the illumination far field. The collector also includes at least one grazing incidence mirror collector subunit including at least one mirror for grazing incidence which transfers the EUV radiation from the radiation source to the illumination far field. The arrangement of the collector subunits is such that a total intensity distribution of the EUV radiation over the far field results which is composed, via different collector beam paths, of a normal incidence mirror intensity distribution, generated by reflection at least also at the normal incidence mirror collector subunit, and of a grazing incidence mirror intensity distribution, generated by reflection at least also at the grazing incidence mirror collector subunit. The total intensity distribution, at least over a section of the far field which is greater than 40% of the total far field, deviates by less than 20% from an average intensity in the section of the far field.

It has been recognized according to the invention that a subdivision of a collector into subunits comprising, on the one hand, at least one mirror for normal incidence and, on the other hand, at least one mirror for grazing incidence affords the possibility of adapting the illumination light far field generated by the collector in a targeted manner with regard to its total intensity distribution for adaptation to predefined values. By way of example, an illumination far field having a particularly homogeneous total intensity distribution can be achieved. This reduces requirements made of an illumination optical unit disposed downstream of the collector, in particular tilting angle requirements for individual mirrors of mirror arrays disposed downstream, for example of facet mirrors disposed downstream, without in this case having to make concessions with regard to complying with illumination requirements for illuminating an illumination field. In particular, an illumination far field having a partially constant far field intensity density can be provided. A constant far field intensity density can be generated in particular up to an outer intensity region of the illumination far field. Usable EUV radiation can then be present within the complete far field. An intensity distribution over the illumination far field can in this case be determined as an area density of the intensity of the radiation source measured over the area of the far field. In particular, a targeted far field profile can be set. This can be used for example to compensate for a telecentricity error of an optical unit disposed downstream of the collector. The normal incidence mirror collector subunit can have a mirror section arranged closest to the radiation source. The mirror section can be arranged relatively far away from the radiation source. An associated loss of intensity density can be compensated for via a design of reflection layers of the collector subunits. At least illumination beam paths for a captured solid angle segment of the entire EUV radiation emitted by the EUV radiation source can be guided via two intermediate foci. Via the subdivision of the far field intensity distribution into at least one normal incidence mirror intensity distribution and at least one grazing incidence mirror intensity distribution which are covered via different collector beam paths, it is possible to close gaps in the solid angle picked up from the radiation source by correspondingly guiding the illumination radiation path toward the far field. In so far as a homogeneous illumination far field is generated by the collector, particularly with the use of a downstream illumination optical unit with a field facet mirror and a pupil facet mirror, the individual facets can be impinged on with little deviation of the respective angle of incidence from an average angle of incidence. If field facets are imaged such that they are being superimposed on one another in the illumination field to be illuminated, beam guiding in the illumination optical unit can be effected with little variation of the associated imaging scales of the field facet imaging. The variation can be significantly less than +/−10%, for example less than +/−5%. The same correspondingly applies to the imaging of an intermediate focus onto the pupil facets. The EUV collector can be embodied such that it captures a large solid angle range of an EUV radiation emission from the radiation source, wherein solid angle ranges of different half-spaces can be captured. The collector can have at least one stop as a protective stop for protecting mirror sections of the collector, in particular for protecting mirrors of the at least one grazing incidence mirror collector subunit. The mirrors of the collector subunits can have differently embodied highly reflective coatings adapted to the respective angles of incidence of the EUV radiation on the mirror sections. The highly reflective layers can be ruthenium layers. The highly reflective layers can be multilayer coatings. The multilayer coatings can be molybdenum/silicon (Mo/Si) layers. Overall, the collector can be embodied in a compact fashion. A structural length of the collector in the direction of an optical axis, which may lie in a plane of symmetry of the collector or coincide with an axis of symmetry, in particular with an axis of rotational symmetry, of the collector, can be small. The collector can provide a comparatively small numerical aperture in an intermediate focal plane. This firstly enables a compact configuration of an illumination optical unit and secondly reduces the requirements made of optical components disposed downstream of the collector. In particular, a tilting angle requirement made of tilting mirrors disposed downstream, in particular made of individual mirrors or facets disposed downstream, decreases. This enables efficient cooling of the mirrors. A mirror for normal incidence is present if an angle of incidence of reflective radiation with respect to the normal to the mirror is at most 35°. A mirror for grazing incidence is present if the angle of incidence with respect to the normal to the mirror is at least 55°, preferably more than 60°, more preferably more than 65°. The number of reflections of the EUV radiation along the different collector beam paths for generating the respective intensity distributions which combine to form the total intensity distribution can vary. The collector beam path of the normal incidence mirror intensity distribution can have exactly one reflection at the normal incidence mirror collector subunit. Alternatively, the collector beam path can have both a reflection at the normal incidence mirror collector subunit and a reflection at the grazing incidence mirror collector subunit. The collector beam path relating to the grazing incidence mirror intensity distribution can have exactly one reflection, namely at the grazing incidence mirror collector subunit. The collector beam path relating to the grazing incidence mirror intensity distribution can also have a plurality of reflections at grazing incidence mirrors or else e.g. a reflection at a normal incidence mirror and at least one reflection at a grazing incidence mirror. Collector beam paths having a plurality of reflections can be coordinated with regard to the involved angles of incidence of the individual rays such that the product of the reflections for the respective individual rays at the different reflection surfaces has the same value for all the individual rays or a large portion of the involved individual rays of a collector beam path within a predefined tolerance range. The grazing incidence mirror intensity distribution is generated by a reflective grazing incidence mirror being involved at least once. The normal incidence mirror intensity distribution is generated by a reflective normal incidence mirror being involved at least once. In principle, configurations of an EUV collector are also possible in which the total intensity distribution is generated exclusively via collector beam paths which are reflected via normal incidence mirrors or via grazing incidence mirrors. That also affords the possibility of realizing a homogeneous total intensity distribution of the far field which, over a section of the far field that is greater than 40% of the total far field, deviates by less than 20% from an average intensity in the section of the far field. The section of the far field is an area section of the far field which extends between different radii of the far field which are measured proceeding from a center of the far field, which can lie on the optical axis of the collector. In this description, a normal incidence mirror also is referred to as a normal mirror and a grazing incidence mirror also is referred to as a grazing mirror.

The section of the far field in which a deviation of less than 20% from an average intensity in the section is realized can be greater than 45%, can be greater than 50%, can be greater than 55%, can be greater than 60%, can be greater than 65%, can be greater than 70%, and can even be greater than 75%, of the total far field. The deviation of the total intensity distribution over the section from the average intensity in the section can be less than 15%, can be less than 10%, and can even be less than 5%.

An arrangement of the collector subunits can be such that in the far field the normal incidence mirror intensity distribution merges continuously into the grazing incidence mirror intensity distribution. Such an arrangement leads to a particularly advantageous profile of the intensity distribution over the illumination far field.

The collector subunits can be arranged in such a way that a number of reflections of the EUV radiation of the collector beam path which generates the normal incidence mirror intensity distribution deviates from a number of reflections of the EUV radiation of the collector beam path which generates the grazing incidence mirror intensity distribution, between the radiation source (3) and a beam guiding component for the EUV radiation (14) that can be arranged downstream. Different numbers of reflections in such an arrangement have proved to be particularly suitable for capturing a large solid angle range of the emitted EUV radiation. The different reflections additionally afford the possibility of design with angles of incidence on the mirrors of the collector subunits which are either advantageously close to normal incidence or advantageously close to grazing incidence. As soon as the number N of the reflections along a collector beam path between the radiation source and a beam guiding component disposed downstream of the collector is at least 2 (N≥2), a homogenization of the far field can be achieved by simultaneous optimization of at least two mirror surfaces. This optimization adapts local normal vectors, curvatures and imaging scales such that the far field is illuminated as desired even with a variable number of reflections and non-constant layer properties. In addition, via a number of reflections where N≥2 for generating at least one far field component, it is possible to vary a higher number of freely selectable design parameters for attaining predefined values for a collector structural length, for a collector operating distance, for a numerical aperture of the collector, for a usable throughput (transmission of the collector) and/or for a far field homogeneity.

The EUV radiation can impinge on mirrors of one of the collector subunits both from the inside and from the outside with respect to a central axis of the collector. Such an arrangement can be realized in a compact fashion. The EUV radiation can impinge on one and the same mirror simultaneously from the inside and from the outside. Alternatively, one of the mirrors can impinged on from the inside, and another mirror from the outside.

At least one of the subunits can have gratings having different grating periods for suppressing different components of disturbing light. Different mirrors impinged on successively of at least one subunit have gratings having different grating periods for suppressing different components of disturbing light. Such gratings can be used efficiently for suppressing disturbing light that cannot be used.

An illumination optical unit includes a collector described above for illuminating an object field that can be imaged by an imaging optical unit with at least one facet mirror for guiding the EUV radiation collected by the collector as illumination light. The advantages of such an illumination optical unit correspond to those which have already been explained above with reference to the collector according to the invention.

An outer contour of an overall reflection surface of the facet mirror can be at least the same size as an outer intensity region of the illumination far field of the collector at the location of the facet mirror. Such a facet mirror uses the entire illumination far field. An outer intensity region of the illumination far field is that region in which at least 5% of a maximum intensity density of the illumination far field arrives.

The advantages of an illumination system including an illumination optical unit described above and at least one EUV radiation source, of a projection exposure apparatus including such an illumination unit and an imaging optical unit for imaging the object field into an image field, of a production method for producing a microstructured component using such a projection exposure apparatus, and of a micro- or nanostructured component produced thereby, correspond to those which have already been explained above with reference to the collector according to the invention and the illumination optical unit according to the invention. The EUV radiation source can be an LPP source.

On account of the efficient collection of the emission from the EUV radiation source, for a given radiation source a greater used light energy is available for projection exposure. Conversely, a given used light energy can be achieved with an EUV radiation source having smaller dimensions. This improves either the throughput during projection exposure or the costs for providing the EUV radiation source.

Exemplary embodiments of the invention are explained in greater detail below with reference to the drawing, in which:

FIG. 1 schematically shows a meridional sectional view through a projection exposure apparatus for EUV projection lithography with an EUV illumination optical unit;

Figure 1:
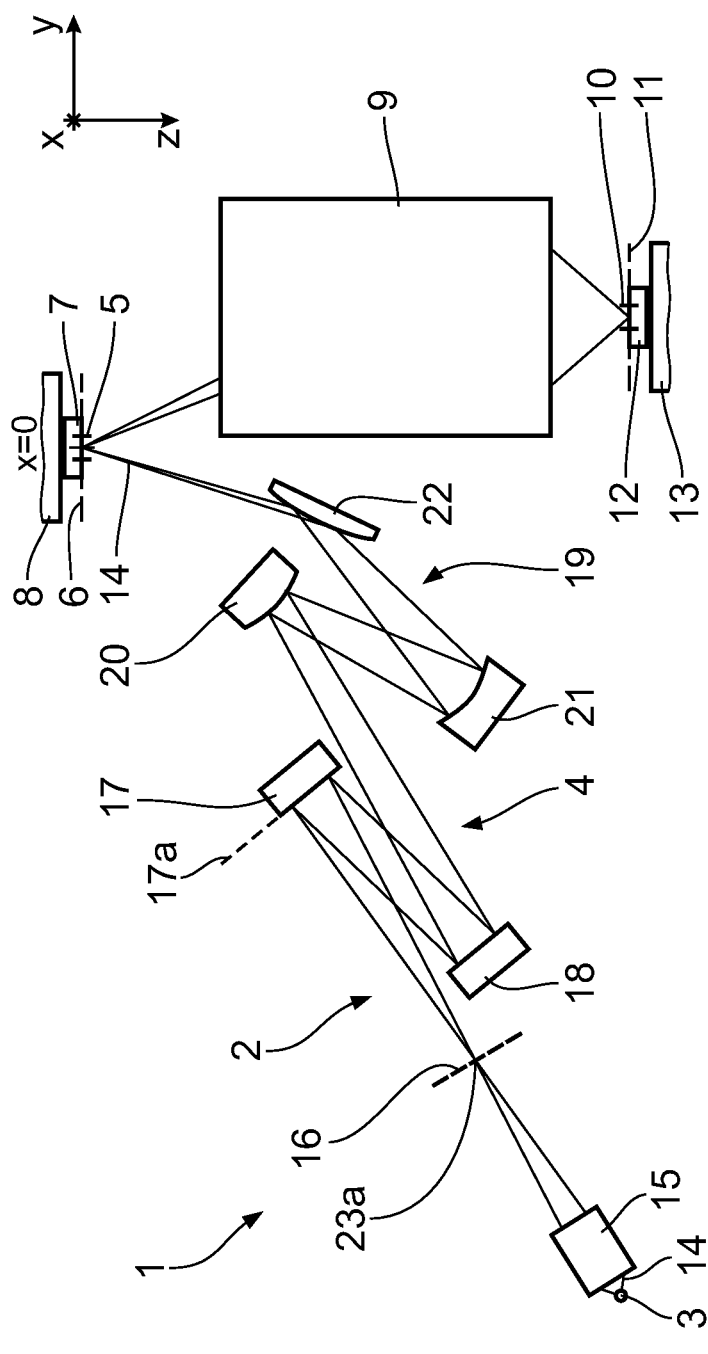
Figure 10:
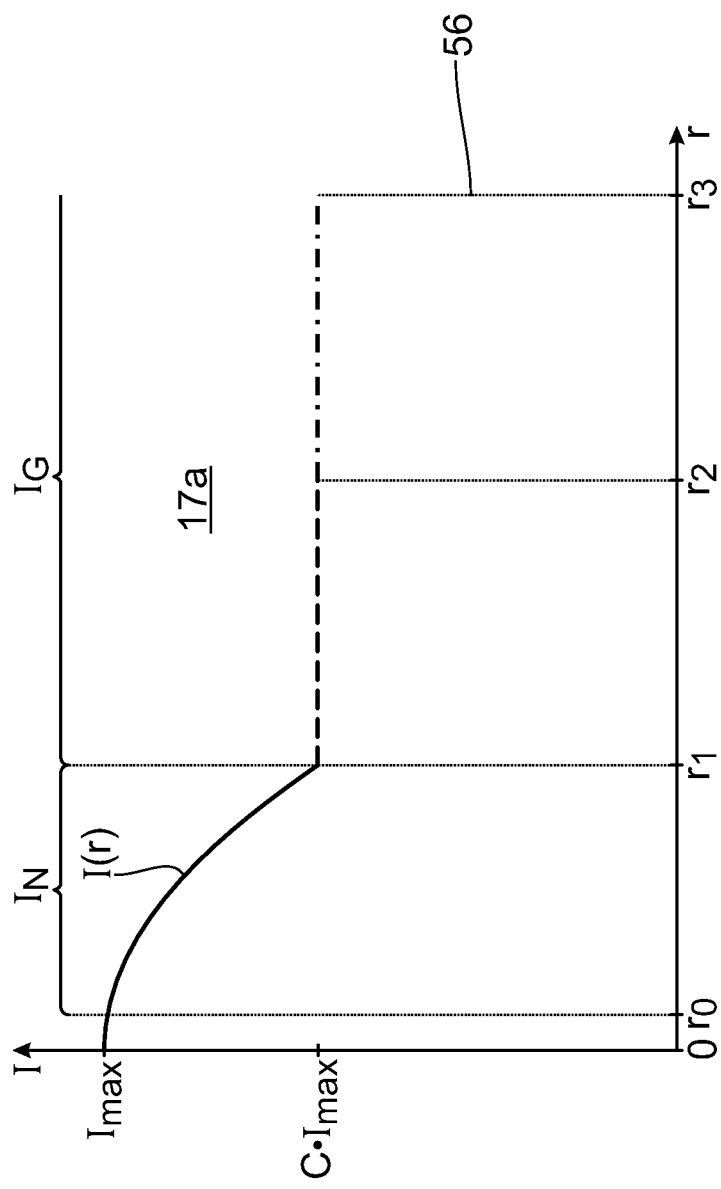
FIG. 10 shows a diagram of a radial intensity distribution of an illumination far field which can be generated with a collector of one of the embodiments according to FIGS. 2 to 8.
Figure 10A:
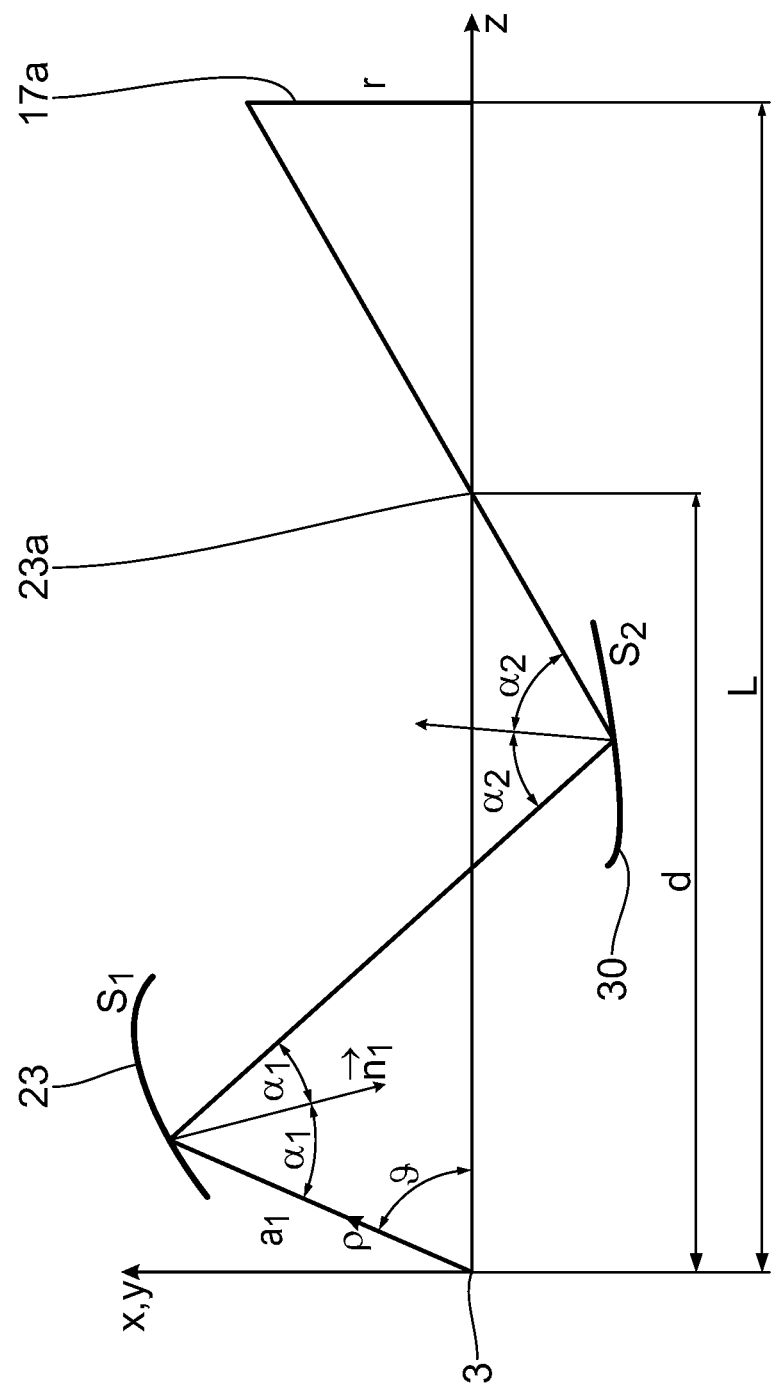
Figure 11:
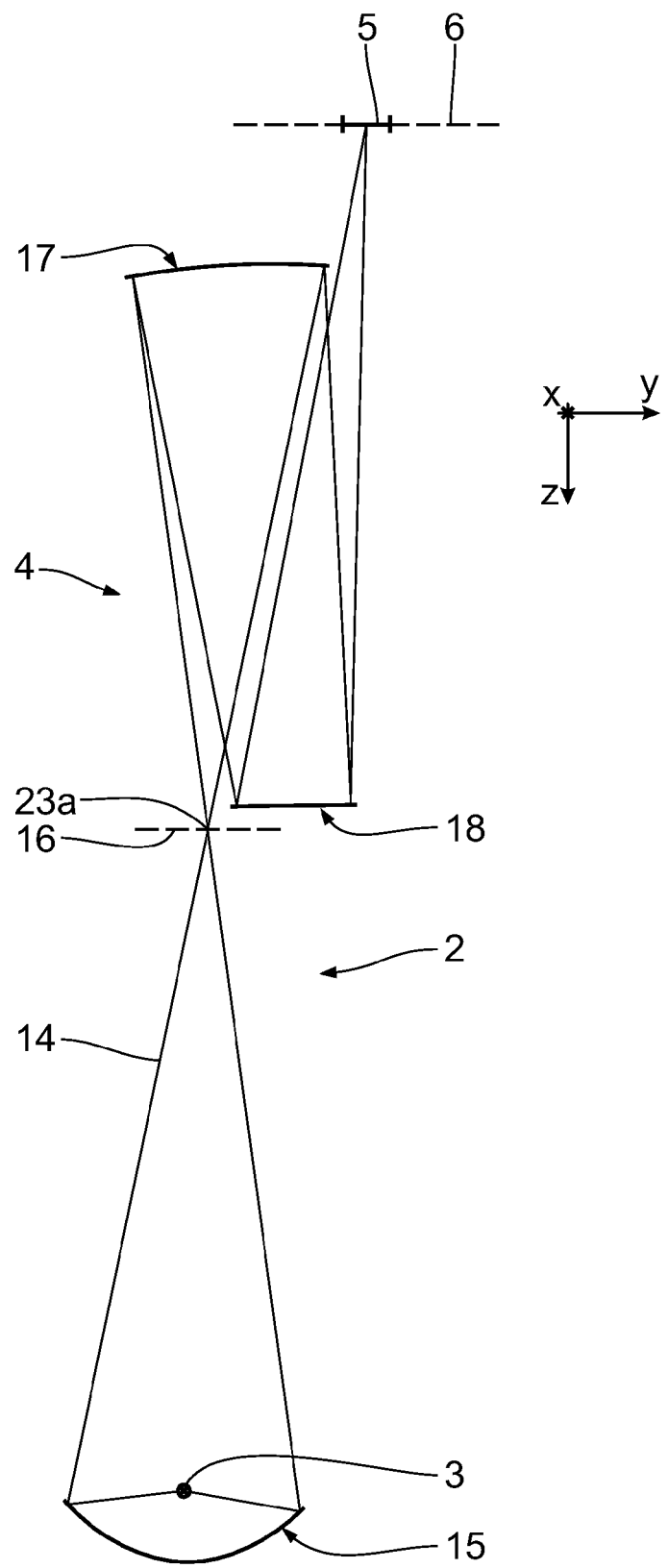

FIG. 10A schematically shows a meridional sectional view through a stylized collector for defining variables which are used for deriving equations used for the arrangement and shaping of mirror subunits of the collector; and FIG. 11 shows a further embodiment of an illumination optical unit for the projection exposure apparatus according to FIG. 1.

FIG. 1 shows schematically in a meridional sectional view a projection exposure apparatus 1 for microlithography. An illumination system 2 of the projection exposure apparatus 1 has, besides a radiation source or light source 3, an illumination optical unit 4 for the exposure of an object field 5 in an object plane 6. A reticle 7, which is arranged in the object field 5 and is held by a reticle holder 8 (illustrated only as an excerpt), is exposed in this case. A projection optical unit 9 serves for imaging the object field 5 into an image field 10 in an image plane 11. A structure on the reticle 7 is imaged onto a light-sensitive layer of a wafer 12 arranged in the region of the image field 10 in the image plane 11, the wafer being held by a wafer holder 13 (likewise illustrated schematically).

The radiation source 3 is an EUV radiation source having an emitted used radiation in the range of between 5 nm and 30 nm. This can be a plasma source, in particular an LPP source (laser-produced plasma). The EUV radiation source can also be, for example, a GDPP source (gas discharge produced plasma). EUV radiation 14 emerging from the radiation source 3 is concentrated by a collector 15. The EUV radiation 14 is also designated hereinafter as illumination light or as imaging light. The collector 15 is illustrated in greater detail in FIG. 2, which will be described below. Downstream of the collector 15, the EUV radiation 14 propagates through an intermediate focal plane 16 before it impinges on a field facet mirror 17. The field facet mirror 17 is arranged in a plane 17a of the illumination optical unit 4 which is optically conjugate with respect to the object plane 6. An illumination far field of the EUV radiation 14 is present in the plane 17a, the illumination far field being formed by the collector 15.

Downstream of the field facet mirror 17, the EUV radiation 14 is reflected by a pupil facet mirror 18. The pupil facet mirror 18 is arranged in a pupil plane of the illumination optical unit 4, the pupil plane being optically conjugate with respect to a pupil plane of the projection optical unit 9. With the aid of the pupil facet mirror 18 and an imaging optical assembly in the form of a transfer optical unit 19 having mirrors 20, 21 and 22 designated in the order of the beam path, field facets of the field facet mirror 17, the field facets being described in even greater detail below, are imaged into the object field 5. The last mirror 22 of the transfer optical unit 19 is a mirror for grazing incidence ("grazing incidence mirror"). The pupil facet mirror 18 and the transfer optical unit 19 form a sequential optical unit for transferring the illumination light 14 into the object field 5. The transfer optical unit 19 can be dispensed with, in particular, if the pupil facet mirror 18 is arranged in an entrance pupil of the projection optical unit 9.

To facilitate the description of positional relationships, FIG. 1 depicts a Cartesian xyz coordinate system as a global coordinate system for describing the positional relationships of components of the projection exposure apparatus 1 between the object plane 6 and the image plane 11. In FIG. 1, the x-axis runs perpendicularly to the plane of the drawing into the latter. The y-axis runs toward the right in FIG. 1. The z-axis runs downward in FIG. 1, that is to say perpendicularly to the object plane 6 and to the image plane 11.

The reticle holder 8 and the wafer holder 13 are both displaceable in a controlled manner such that, during the projection exposure, the reticle 7 and the wafer 12 are scanned in a displacement direction, namely in the y-direction, by the object field 5, on the one hand, and by the image field 10, on the other hand. The displacement direction y is also designated hereinafter as the scanning direction.

The collector 15 is explained in greater detail below with reference to FIG. 2. The collector 15 serves for transferring the EUV radiation 14, that is to say an emission from the non-directionally emitting EUV radiation source 3, into a principal focal spot in the intermediate focal plane 16, that is to say into an intermediate focus 23a, and subsequently for generating the illumination far field 17a.

The collector 15 has a normal incidence mirror collector subunit in the form of a collecting mirror 23, the EUV radiation 14 impinging on the inner wall of the collecting mirror. For the case where the collecting mirror 23 transfers the EUV radiation 14 from the EUV radiation source directly into the intermediate focus 23a, the following holds true: the EUV radiation source 3 lies at a first focal point of the collecting mirror 23, the first focal point being adjacent to the collecting mirror 23. The intermediate focus 23a in the intermediate focal plane 16 lies at a second focal point of the collecting mirror 23, the second focal point being further away from the collecting mirror 23.

The collecting mirror 23 has a through opening 25 in the region of an intersection point of a central axis 24 of rotational symmetry of the collector 15, the two focal points lying on the axis. The axis 24 of rotational symmetry is also designated as the optical axis of the collector 15. Laser radiation from a plasma-generating pump laser (not illustrated) can be coupled in through the through opening 25.

Angles α of incidence or reflection of individual rays 26 of the EUV radiation 14 on the normal mirror collector subunit 23 are in the range of between approximately 8° and approximately 25°. The angles α of incidence are indicated as usual as angles with respect to the normal to the respective reflection section of the normal mirror collector subunit. On account of the fulfilled condition for the angle of incidence of α<35°, the collecting mirror of the normal mirror collector subunit 23 is a mirror for normal incidence.

The first mirror 23 is subdivided into a central collecting mirror section 27, which delimits the through opening 25 toward the inside, and into an outer collecting mirror section 28 surrounding the central collecting mirror section. The two collecting mirror sections 27, 28 merge seamlessly into one another in a transition region 29. In the transition region 29, the angle α of incidence of the individual rays 26 on the collecting mirror 23 changes abruptly. Near the transition region 29, the angle α of incidence on the central collecting mirror section 27 is approximately 18° and near the transition region 29 to the outer collecting mirror section 28 decreases again to a value of approximately 8°.

The collector 15 furthermore has a grazing incidence mirror collector subunit 30 comprising a mirror for grazing incidence embodied approximately in the form of a lateral surface of a truncated cone. The truncated-cone-like mirror 30 opens from a smaller through opening 31, which faces the radiation source 3, toward a larger through opening 32, which faces the intermediate focal plane 16. An inner wall 33 of the truncated-cone-like mirror 30 reflects the EUV radiation 14 from the outer collecting mirror section 28 toward the intermediate focus in the intermediate focal plane 16. Individual rays 26 reflected from the outer collecting mirror section 28 toward the truncated-cone-like mirror 30 cross the optical axis 24.

Angles of incidence of the EUV radiation 14 on the inner wall 33 are the largest adjacent to the through opening 31, where they are approximately 75°. Toward the other through opening 32, the angle of incidence of the individual rays 26 of the EUV radiation 14 on the inner wall 33 of the truncated-cone-like mirror 30 decreases continuously to a value of approximately 65°. Since the condition α65° is fulfilled for the angles α of incidence on the inner wall 33 of the truncated-cone mirror 30, the truncated-cone-like mirror 30 is a mirror for grazing incidence.

The central collecting mirror section 27 reflects the EUV radiation 14 from the radiation source 3 directly to the intermediate focus in the intermediate focal plane 16, this directly reflected EUV radiation passing through both through openings 31, 32 of the truncated-cone-like mirror 30.

Between the radiation source 3 and the grazing mirror collector subunit 30, a protective stop 34 is arranged in the region of the optical axis 24, the protective stop preventing radiation and/or particles from the radiation source 3 from directly reaching the truncated-cone-like mirror 30. The protective stop 34 can be embodied in an actively cooled fashion.

FIG. 10 schematically shows a dependence of an intensity I of the EUV radiation 14 on a radius r, that is to say a distance to the optical axis 24. Up to a first, small radius value $r_0$, the intensity is zero on account of a central shading of the EUV radiation 14 by the through opening 25 or by the protective stop 34. In the range between the radii $r_0$ and $r_1$, the intensity I(r) decreases from a maximum value $I_{max}$ at the radius $r_0$ approximately parabolically to a value $C \cdot I_{max}$ at the radius $r_1$. The profile of I(r) in the range between $r_0$ and $r_1$ is determined by the dependence of the reflectivity of the EUV radiation at the central collecting mirror section 27 and the variation of the local imaging scale, that is to say a ratio of the front and back focal lengths/light paths. This dependence can be influenced via a corresponding highly reflective coating of the inner wall of the central collecting mirror section 27. The value of the constant C, which can be in the range of between 0.6 and 0.8, for example, can be influenced by corresponding configuration of the collector beam paths.

A further profile of the intensity I(r) between the radii $r_1$ and $r_3$ is substantially constant at the value $C \cdot I_{max}$. This constant profile is determined by the angles of incidence and thus the shaping of the reflection surfaces firstly of the inner wall of the outer collecting mirror section 28 and secondly of the inner wall 33 of the truncated-cone-like mirror 30. A highly reflective coating is provided firstly on the inner wall 33 of the truncated-cone-like mirror 30 and secondly on the inner wall of the outer collecting mirror section 28. An outer intensity region of the illumination far field 17a lies at the radius $r=r_3$.

The arrangement of the collector subunit 23, 30 is such that the total intensity distribution I(r) of the EUV radiation 14 over the far field 17a results which, via different collector beam paths, is composed of a normal mirror intensity distribution IN between the radii $r_0$ and $r_1$ (illustrated by a solid line in FIG. 10) and a substantially constant grazing mirror intensity distribution $I_G$ between the radii $r_1$ and $r_3$ (illustrated by a dashed and dash-dotted line in FIG. 10). The normal mirror intensity distribution IN is generated by reflection at the normal mirror collector subunit 23. The grazing mirror intensity distribution $I_G$ is generated by reflection additionally at the grazing mirror collector subunit 30. The local imaging scales optimized appropriately for the reflectivities firstly at the collecting mirror 23 and secondly at the truncated-cone-like mirror 30 give rise, as a result, to the substantially constant intensity $C \cdot I_{max}$ in the radius range between $r_1$ and $r_3$.

Between the radii $r_1$ and $r_3$, that is to say in a section of the total far field 17a which is greater than 40% of the total far field 17a, the intensity distribution I(r) deviates by less than 20% from an average intensity $C \cdot I_{max}$ in the section of the far field between the radii $r_1$ and $r_3$. In the idealized example illustrated, the deviation is even 0. Depending on the embodiment of the collector 15, the section of the far field 17a in which the deviation of less than 20% from the average intensity in the section is realized can be greater than 45%, can be greater than 50%, can be greater than 55%, can be greater than 60%, can be greater than 65%, can be greater than 70%, and can even be greater than 75%, of the total far field 17a. Depending on the embodiment of the collector 15, the deviation of the total intensity distribution I(r) over the section from the average intensity $C \cdot I_{max}$ in the section of the far field 17a can be less than 15%, can be less than 10%, and can even be less than 5%.

The normal mirror intensity distribution IN merges continuously into the grazing mirror intensity distribution $I_G$ at the radius $r_1$. A limiting beam path in the region of this transition is indicated in a dashed manner at 34a in FIG. 2.

By the addition of a second reflection—in comparison with the sole use of a continued ellipsoid 27 of revolution (shown by a thin line without a reference numeral in FIG. 2)—with the same operating distance and the same maximum collector radius at the same time a smaller numerical aperture at the intermediate focus and a greater transmission are achieved. In this case, the form of the two subunits 23, 30 is optimized such that the resulting far field is illuminated with a constant intensity density, without having to abandon the intermediate focus in this case. The layer reflectivities are already taken into account in this optimization. The homogeneous illumination and the greater transmission are achieved despite the additional reflection.

The homogeneous far field illumination has the effect that the illumination channels all have practically the same brightness. Therefore, there is no longer a need to carry out an intensity mixing of the illumination channels that are being superimposed on one another in the object field 5 by mixing illumination channels formed by the field facets of the field facet mirror 17 and the pupil facets of the pupil facet mirror 18. Tilting angle requirements for the facet mirrors and the angle-of-incidence burden can be reduced. On account of the reduced tilting angle requirements, the facet mirrors can be thermally linked well to mirror carriers. Less intense mixing also has the effect that imaging scales firstly during an imaging of the radiation source 3 onto the pupil facets of the pupil facet mirror 18 and secondly during an imaging of the field facets of the field facet mirror 17 into the object field 5 do not vary greatly. Both the object field 5 and an illumination pupil can therefore be filled/shaped with great precision. On account of the reduced tilting angle requirements, it is possible to avoid an undesired rotation of images of the field facets relative to one another during the superimposing imaging onto the object field 5. With the use of micromirrors for the facet mirrors, it is possible to produce, in particular, a rectangular object field 5 with low reflection losses.

For designing the arrangements and the shapings of the subunits 23, 30 of the EUV collector 15 in order to achieve a total intensity distribution I(r) in the manner of the intensity distribution described above, the following procedure is adopted:

The conservation of energy in differential form is applicable:

$$T(\partial)Q(\partial)\sin \partial d\partial d\phi = +/- I(r) r dr d\phi \quad (1)$$

On the left-hand side of equation (1) above is the energy emitted by a point source having a rotationally symmetrical emission characteristic $Q(\partial)$ into a differential solid angle element, multiplied by the transmission T of this light beam on the path from the source to the target region. In this case, the transmission T includes the reflectivities of the mirrors and, if appropriate, also losses as a result of gas absorption. This energy must be identical to the energy—illustrated on the right-hand side of equation (1)—in the associated target region, that is to say the illumination far field 17a, which is additionally intended to be illuminated with the desired intensity density or intensity distribution I(r). In this case, $\phi$ is the azimuth angle in the illumination far field 17a. The sign on the right-hand side of equation (1) is chosen depending on the boundary conditions of the desired arrangement. For example there are cases entirely relevant in practice where dr<0 if d$\partial$>0.

Thus, the conservation of energy gives rise directly to a differential equation describing a sought coordinate transformation r($\partial$):

$$\frac{dr}{d\partial} = +/- \frac{T(\partial)Q(\partial)\sin\partial}{I(r)r} \quad (2)$$

It is necessary to specify an optical system which realizes precisely this transformation r($\partial$). In the simplest case, an individual area suffices for this purpose. If the area is suitably parameterized, this yields a second differential equation and together then a coupled system of two nonlinear ordinary differential equations. One case of interest in practice is the case which additionally demands the intermediate focus 23a. The latter can be realized together with a far field intensity as desired only with at least two reflections. The further procedure will now be described by way of example for this case. The two mirrors S1 at the location of the normal mirror collector subunit 23 and S2 at the location of the grazing mirror collector subunit 30 are in this case parameterized, as shown in FIG. 10A, with the distance between the first mirror S1 and the plasma, $a_1$, and the z-coordinate of the second mirror S2, $z_2$. In order to derive a differential equation for $a_1$, we start with a function $\psi(\partial, \rho)$, for which the mirror S1 represents an equipotential surface $\psi(\rho^2 = x^2 + y^2 + z^2)$. $\partial$ and $\rho$ are polar coordinates in the plane of the drawing in FIG. 10A. Thus, a differential equation for $a_1$ can now be formulated via the partial derivative of $\psi$.

$$\Psi(\vartheta, a_1(\vartheta)) = \text{constant}; \quad (3)$$

$$\frac{d\psi(\vartheta, a_1(\vartheta))}{d\vartheta} = \frac{\partial\psi}{\partial\vartheta} + \frac{\partial\psi}{\partial a_1}\frac{da_1}{d\vartheta} = 0 \Leftrightarrow \frac{da_1}{d\vartheta} = -\frac{\frac{\partial\psi}{\partial\vartheta}}{\frac{\partial\psi}{\partial a_1}}$$

Since S1 is an equipotential surface of $\psi$, the local normal to the mirror, $\vec{n_1}$, must be parallel to the gradient of $\psi$.

$$\gamma\vec{n_1} = \vec{\nabla}\psi|_{a_1(\vartheta)} = \frac{1}{a_1}\frac{\partial\psi}{\partial\vartheta}\vec{e_\vartheta} + \frac{\partial\psi}{\partial\rho}\vec{e_\rho} \quad (4)$$

In this equation (4), $\gamma$ is a proportionality factor.

Thus, it is now possible to eliminate the partial derivative of the function $\psi$ and this yields the sought conditional equation for the first mirror surface.

$$\frac{da_1}{d\vartheta} = \frac{-1}{a_1}\frac{\vec{e_\vartheta}\cdot\vec{n_1}}{\vec{e_\rho}\cdot\vec{n_1}} \quad (5)$$

Since the intermediate focus 23a between the second mirror and the target region is demanded in this example, a simple geometrical relationship between $z_2$ and r results.

$$\frac{z_2 - d}{r_{S2}} = \frac{L - d}{r}, \quad z_2 = \frac{r_{S2}(L-d)}{r} + d \quad (6)$$

In this case, d is the distance between the source and the intermediate focus 23a. $r_{S2}$ is the z-coordinate of the mirror S2. L is the distance between the far field 17a and the source 3.

From this relationship, the total derivative of $z_2$ can now be calculated via the chain rule.

$$\frac{dz_2}{d\vartheta} = \frac{L-d}{r}\frac{dr_{S2}}{d\vartheta} + \frac{-r_{S2}(L-d)}{r^2}\frac{dr}{d\vartheta} = \frac{L-d}{r}\frac{\partial r_{S2}}{\partial z_2}\frac{dz_2}{d\vartheta} + \frac{-(z_2-d)}{r}\frac{dr}{d\vartheta} \quad (7)$$

Slight transformations then lead to a third differential equation for $z_2$.

$$\frac{dz_2}{d\vartheta} = \frac{-(z_2 - d)}{r - m(L - d)} \frac{dr}{d\vartheta}, m = \frac{\partial r_{S2}}{\partial z_2} \quad (8)$$

In this case, m is the gradient of the surface of the mirror S2.

With equations (2), (5) and (8), a system of three nonlinear, coupled, ordinary differential equations is now present in explicit form and can easily be solved by standard methods as an initial-value problem. The expressions not yet explicitly indicated for the normal $\vec{n}_1$ to the surface S1 result in a simple manner from the law of reflection. The angles $\alpha_1$ and $\alpha_2$ of incidence that are required for the evaluation of the transmission are likewise obtained directly.

Figure 3:
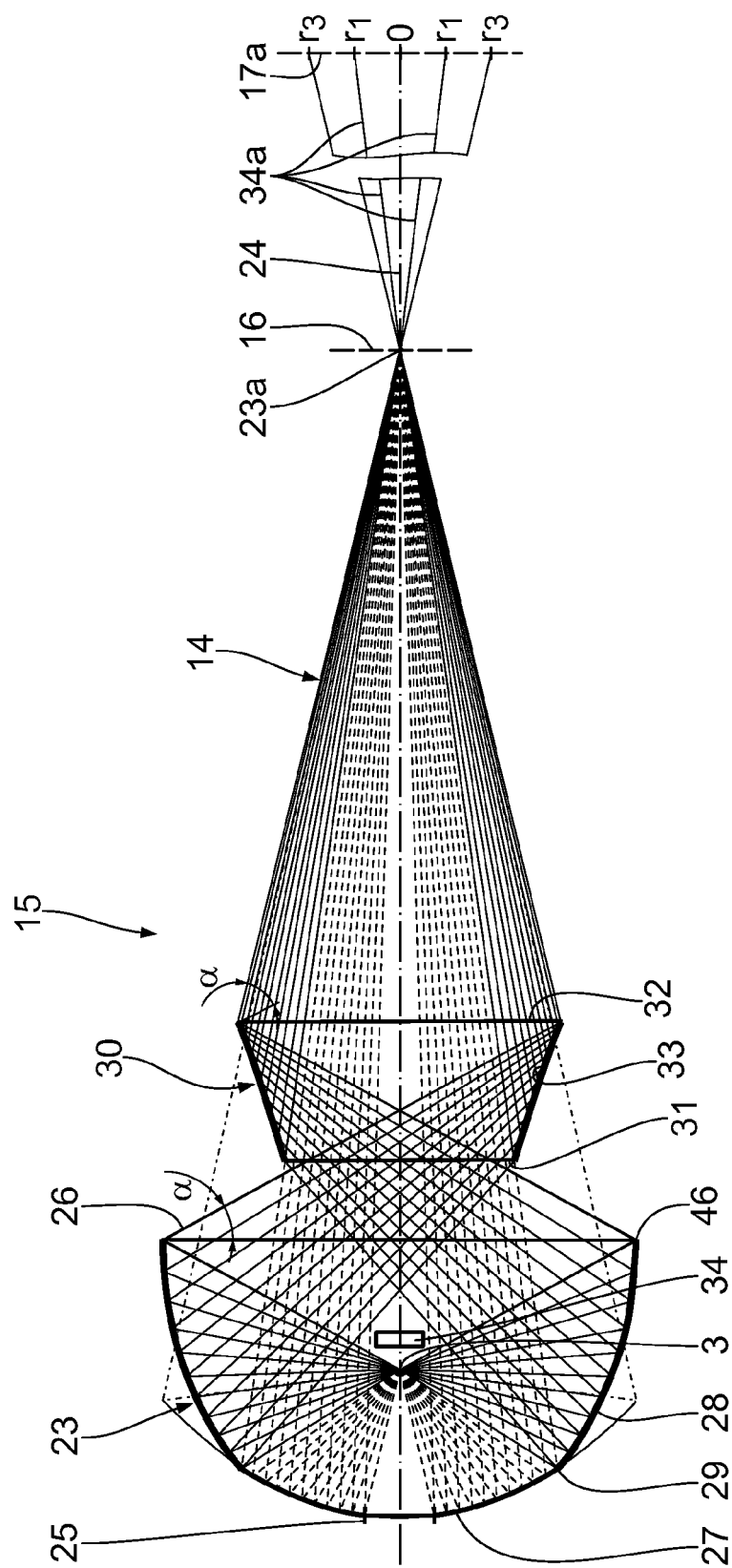

FIG. 3 shows a further embodiment of the collector 15. Components corresponding to those which have been described above with reference to the figures already explained above bear the same reference numerals and will not be discussed in detail again.

In the embodiment according to FIG. 3, the collecting mirror sections 27 and 28 of the normal mirror collector subunit 23, on the one hand, and the truncated-cone-like mirror 30 of the grazing mirror collector subunit, on the other hand, in each case cover a larger solid angle of the EUV radiation 14 emitted by the radiation source 3. A greater variation of the angles of incidence of the individual rays 26 on the mirror surfaces involved accordingly arises. A maximum angle $\alpha$ of incidence in the region of an outer edge of the outer collecting mirror section 28 is approximately 28°. A minimum angle $\alpha$ of incidence on the inner wall 33 of the truncated-cone-like mirror 30 in the region of the through opening 32 is approximately 55°. The conditions indicated above for normal incidence, on the one hand, and for grazing incidence, on the other hand, are therefore also fulfilled in the case of the embodiment of the collector 15 according to FIG. 3.

In the embodiment according to FIG. 3, the far field 17a is manifested qualitatively in just the same way as described in connection with FIG. 10. Only the absolute values for C, $r_1$ and $r_3$ are accordingly shifted.

A further embodiment of the collector 15 is described below with reference to FIG. 4. Components corresponding to those which have been described above with reference to the figures already explained above bear the same reference numerals and will not be discussed in detail again.

Figure 4:
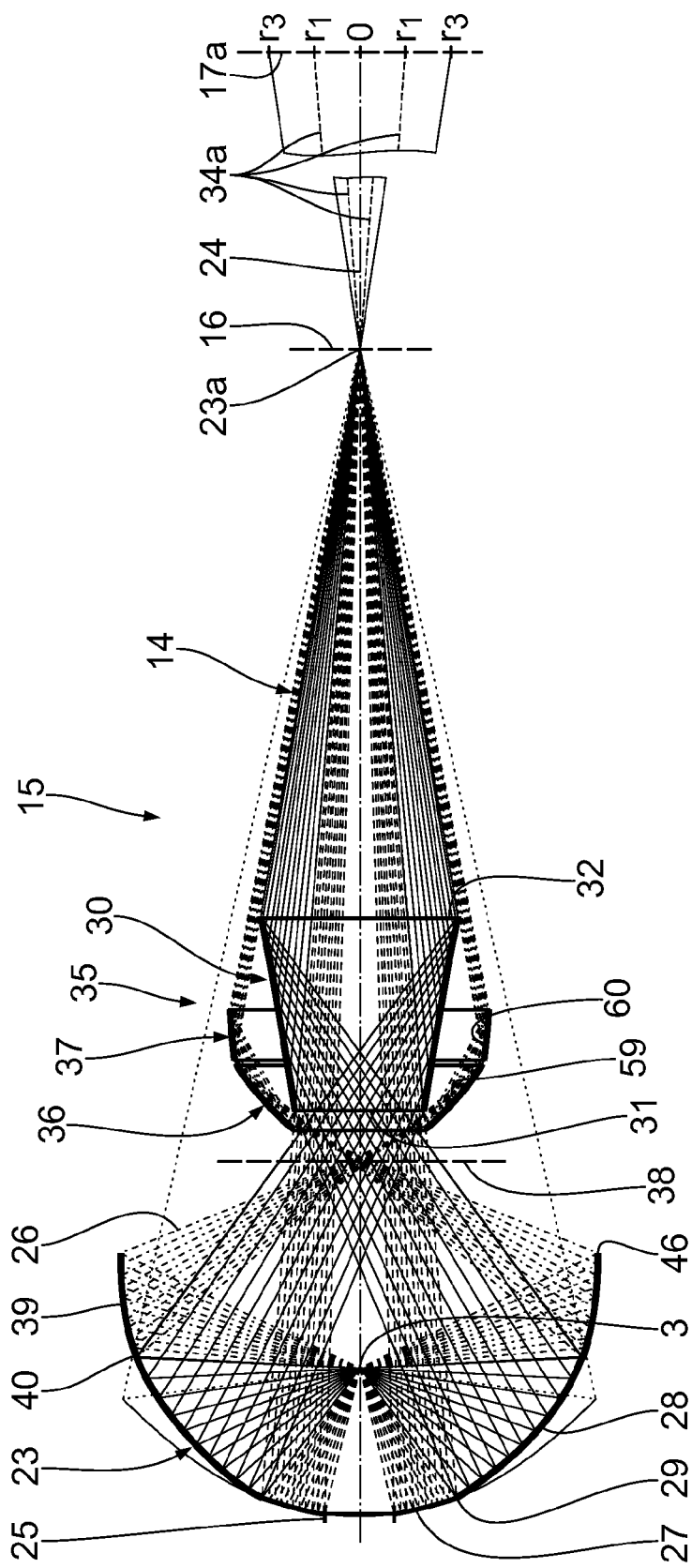

A grazing mirror collector subunit 35 of the collector 15 according to FIG. 4 comprises, besides the truncated-cone-like mirror 30, two grazing mirror sections 36, 37 as well. An input-side intermediate focus 38 of the two grazing mirror sections 36, 37 lies between the radiation source 3 and the intermediate focus in the intermediate focal plane 16. The intermediate focus 38 is not sharply defined. The intermediate focus 38 lies spatially between the radiation source 3 and the leading through opening 31 of the truncated-cone-like mirror 30. The grazing mirror section 36 is arranged spatially between the outer collecting mirror section 28 of the normal mirror collector subunit 23 and the grazing mirror section 37 and surrounds the truncated-cone-like mirror 30 in the region of the leading through opening 31. The further grazing mirror section 37 is arranged directly adjacent to the first grazing mirror section 36 and surrounds the truncated-cone-like mirror 30 in a section between the two through openings 31 and 32.

Figure 2:
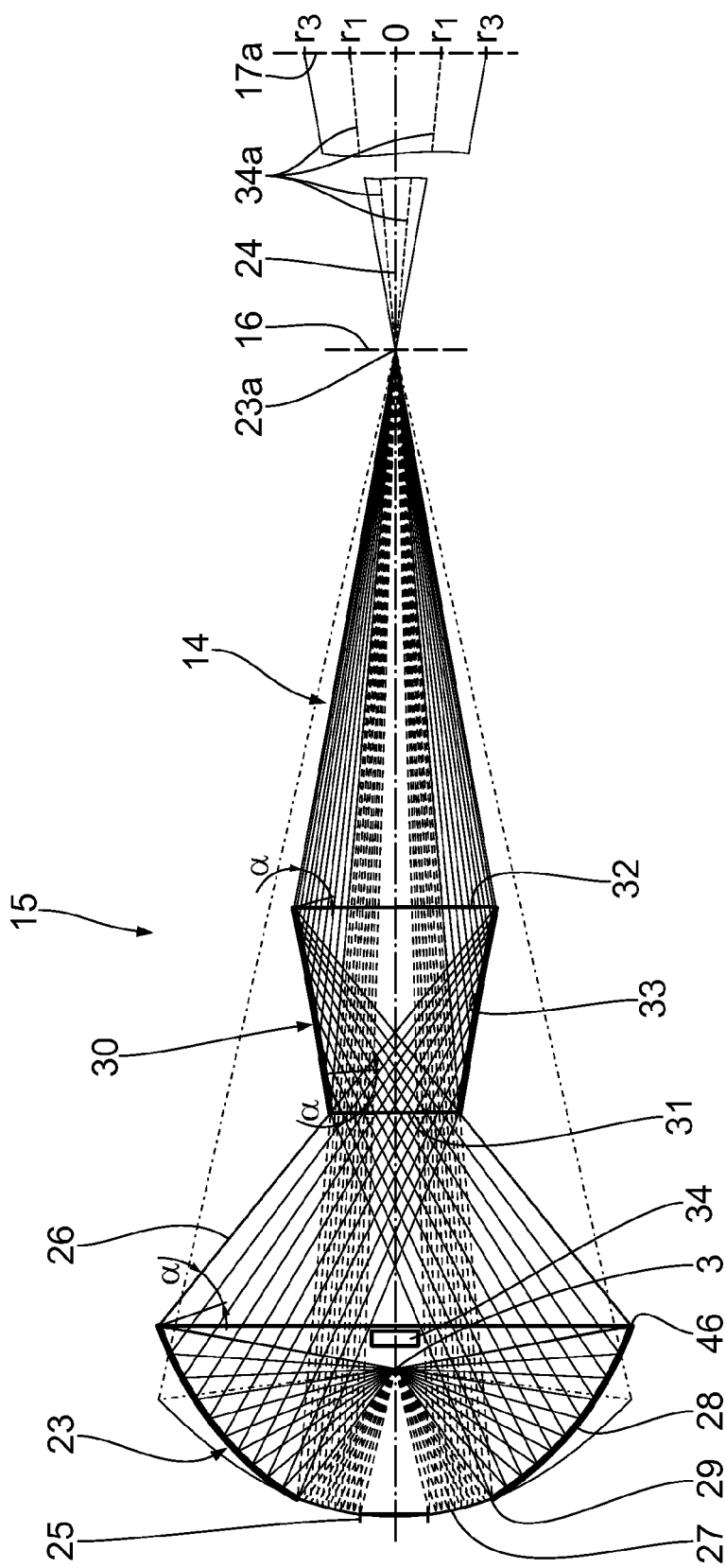
FIGS. 2 to 8 show embodiments of collectors for transferring an emission from a non-directional EUV radiation source of the projection exposure apparatus according to FIG. 1 into a principal focal spot arranged at the location of an intermediate focus of the illumination optical unit, likewise in a meridional sectional view.

The truncated-cone-like mirror 30 and the normal mirror collector subunit 23 correspond, with regard to their arrangement, to the components described above in connection with the collector 15 according to FIG. 2. One difference is that the outer collecting mirror section 28 in the case of the embodiment according to FIG. 2 now constitutes, in the case of the collecting mirror 23 according to FIG. 4, a middle collecting mirror section arranged between the central collecting mirror section 27 and—in the case of the embodiment according to FIG. 4—additional outer collecting mirror section 39.

The outer collecting mirror section 39 merges via a further transition region 40 into the now middle collecting mirror section 28 of the normal mirror collector subunit 23. At the transition region 40, too, as already explained above in connection with the transition region 29, a sudden change occurs in the angles of incidence on the normal mirror collector subunit 23.

With the outer collecting mirror section 39, the solid angle of the emission from the EUV radiation source 3 that is captured by the normal mirror collector subunit 23 is increased again, which is illustrated in FIG. 4 by a dash-dotted beam path of the individual rays 26. Along this beam path, the EUV radiation 14 is reflected firstly at the outer grazing mirror section 36 and subsequently at the further grazing mirror section 37 of the grazing mirror collector subunit 35, and from there toward the intermediate focus in the intermediate focal plane 16. Angles of incidence of the individual rays 26 at the grazing mirror sections 36, 37 are once again greater than 65°.

An intensity distribution of the EUV radiation 14 which is generated in the illumination far field 17a by the collector 15 according to FIG. 4 corresponds qualitatively to the distribution already explained above with reference to FIG. 10. The far field 17a is now generated by three different collector beam paths. Between the radii $r_0$ and $r_1$, the far field 17a is generated by reflection at the central collecting mirror section 27. Between the radii $r_1$ and $r_2$, the far field 17a is generated by reflection at the truncated-cone-like mirror 30. Between the radii $r_2$ and $r_3$, the far field is generated by the grazing reflection at the grazing mirror sections 36 and 37. A distribution of a ray deflection by grazing reflection onto two successive mirrors, as in the case of the grazing mirror sections 36 and 37, results there in large angles of incidence. In this case, the product of the reflectivities is greater than those of an individual reflection with the same total deflection angle.

In the case of the embodiment according to FIG. 4, a number of the reflections of the EUV radiation for the collector beam path which generates the normal mirror intensity distribution IN differs from a number of reflections of the EUV radiation in the collector beam path which generates the grazing mirror intensity distribution. The number N of the reflection surfaces is N=1 in the case of the collector beam path for the normal mirror intensity distribution and N=2 (radius range $r_1$ to $r_2$, illustrated by a dashed line in FIG. 10) or N=3 (radius range between $r_2$ and $r_3$, illustrated by a dash-dotted line in FIG. 10) in the case of the collector beam path for the grazing mirror intensity distribution $I_G$.

Since the mirrors of the grazing mirror collector subunit 35 lie one inside another, this arrangement is also designated as a nested mirror arrangement.

A further embodiment of the collector 15 is described below with reference to FIG. 5. Components corresponding to those which have been described above with reference to the figures already explained above bear the same reference numerals and will not be discussed in detail again.

Figure 5:
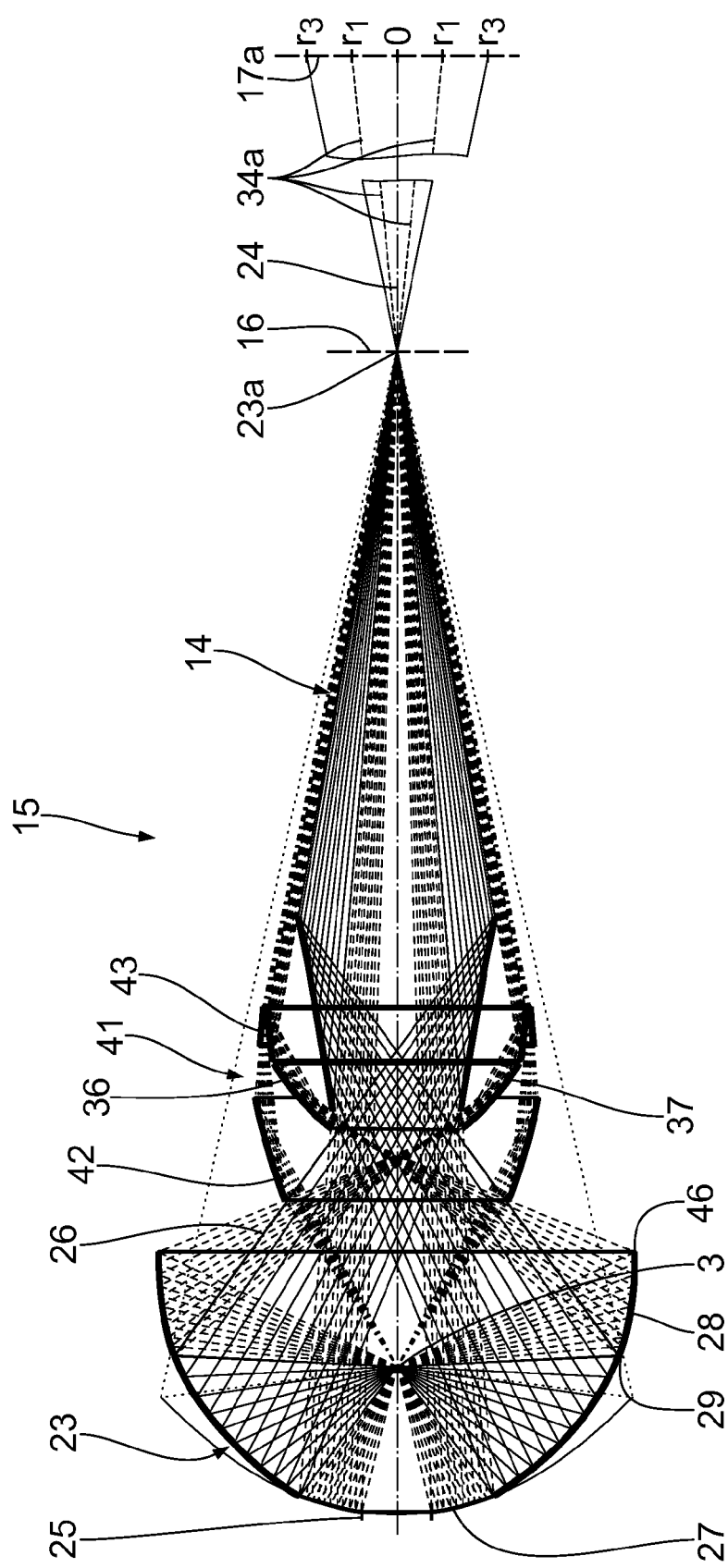

In terms of the basic construction, the collector 15 according to FIG. 5 corresponds to that according to FIG. 4. In addition, a grazing mirror collector subunit 41 in the case of the collector 15 according to FIG. 5 has two further grazing mirror sections 42, 43. An input-side focal point of the sections 42, 43 coincides with the radiation source 3. An output-side focal point of the sections 42, 43 in turn coincides with the intermediate focus in the intermediate focal plane 16.

The grazing mirror section 42 surrounds the grazing mirror section 36 in the region of an entrance-side through opening of the grazing mirror section 36. The further grazing mirror section 43 surrounds the grazing mirror section 37. Via the grazing mirror sections 42, 43, EUV radiation 14 is guided directly from the radiation source 3 toward the intermediate focus in the intermediate focal plane 16, that is to say not via a reflection at the normal mirror collector subunit 23. The beam path of the EUV radiation 14 guided in this way runs from the radiation source 3 directly to the grazing mirror section 42, from there to the grazing mirror section 43 and from there to the intermediate focus in the intermediate focal plane 16.

In the case of the grazing mirror sections 36, 37, 42 and 43, the EUV radiation 14 impinges in each case on an inner wall. Angles of incidence of the EUV radiation at the grazing mirror sections 42, 43 are once again greater than 65° in each case.

With the grazing mirror sections 42, 43, a further far field section is generated in the far field 17a at larger radii via the additional, fourth collector beam path. The far field generated once again corresponds qualitatively to the radial intensity distribution already explained above with reference to FIG. 10. Via the grazing mirror sections 42, 43, in the range $r > r_3$ it is also possible to generate a continuation of the far field with an intensity $I = C \cdot I_{max}$.

A further embodiment of the collector 15 is described below with reference to FIG. 6. Components corresponding to those which have been described above with reference to the figures already explained above bear the same reference numerals and will not be discussed in detail again.

Figure 6:
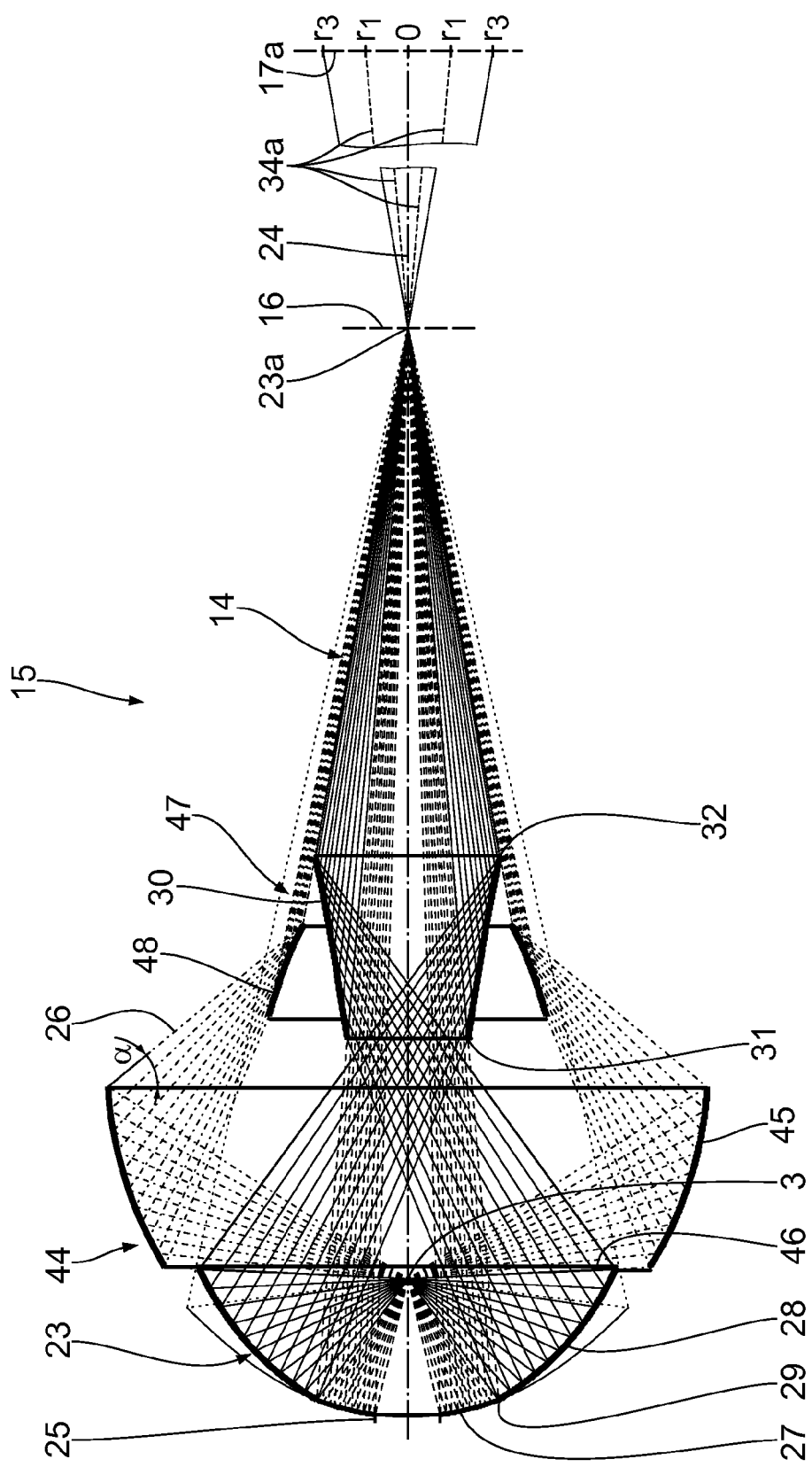

In the case of the collector mirror 15 according to FIG. 6, a normal mirror collector subunit 44 has, besides the collecting mirror 23, which corresponds to the embodiment according to FIG. 2, a further collecting mirror section 45 as well. Angles of incidence on the collecting mirror section 45 are approximately in the range of $\alpha = 35°$. Therefore, the condition for normal incidence as stipulated above is fulfilled in this case as well.

The collecting mirror section 45 continues the collecting mirror 23 after the main opening 46 thereof, wherein, in the region of the main opening 46, the diameter of the collecting mirror section 45 is greater than that of the collecting mirror 23, such that the collecting mirror section 45 constitutes a component separate from the collecting mirror 23. The collecting mirror section 45 captures a wider solid angle range of EUV radiation 14 emerging from the radiation source 3. An associated beam path of the individual rays 26 is illustrated in a dash-dotted manner in FIG. 6.

A grazing mirror collector subunit 47 of the collector 15 according to FIG. 6 includes, besides the truncated-cone-like mirror 30, a further grazing mirror section 48 as well. The latter surrounds the truncated-cone-like mirror 30. The EUV radiation 14 impinges on the grazing mirror 48 from the outside with respect to the optical axis 24. The individual rays 26 of the EUV radiation 14 which impinge directly on the collecting mirror section 45 are reflected from there toward the grazing mirror section 48, which in turn transfers the EUV radiation in a grazing manner toward the intermediate focus in the intermediate focal plane 16.

In the case of an illumination far field 17a generated by the collector 15 according to FIG. 6, a far field component of the intensity I arises in addition to the far field of the collector 15 according to FIG. 2 in a range $r > r_2$ (cf. FIG. 10), which far field component can in turn have a value of $C \cdot I_{max}$. Therefore, the illumination far field of the collector 15 according to FIG. 6 once again corresponds qualitatively to that which has already been explained above in connection with FIG. 10.

It is also possible to increase an operating distance of the collector mirrors without changing the distance of the focal points or the aperture at the intermediate focus in the process. This is explained below with reference to the collector 15 according to FIG. 7.

Components corresponding to those which have been described above with reference to the figures already explained above bear the same reference numerals and will not be discussed in detail again.

Figure 7:
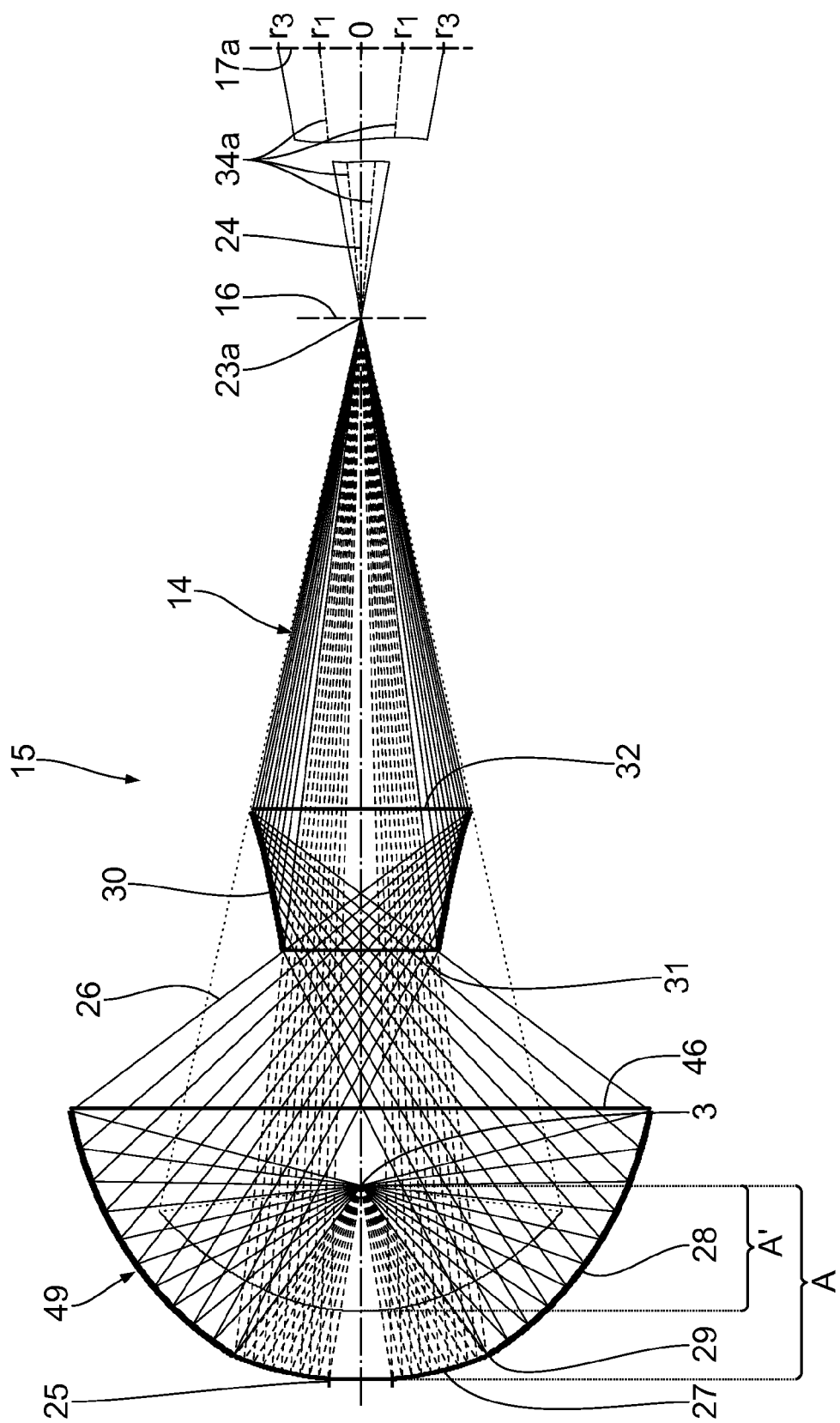

In the case of a normal mirror collector subunit 49 of the collector 15 according to FIG. 7, the operating distance A between the radiation source 3 and the collecting mirror 49 in the region of the through opening 25 is significantly increased compared with a corresponding operating distance A' of the collector 15 according to FIG. 2, which is depicted in FIG. 7 for comparison purposes. Otherwise the embodiment according to FIG. 7 corresponds qualitatively to that according to FIG. 2.

By increasing the operating distance A it is possible to increase the lifetime of the mirrors since impingement of contamination on the mirrors per unit area is correspondingly reduced. In order that the aperture at the intermediate focus is kept constant with the increased operating distance A, it is possible to increase the intensity density, the profile of which otherwise corresponds qualitatively to that according to FIG. 10, in the range between $r_1$ and $r_2$ with a constant gradient between a value $C_1 \cdot I_{max}$ and a value $C_2 \cdot I_{max}$, wherein $C_2 > C_1$ holds true. Starting from the radius $r_2$, the intensity $I(r)$ can then be constant again at $C_2 \cdot I_{max}$ up to the edge of the illumination far field 17a.

Alternatively, the intensity distribution $I(r)$ can be coordinated such that the illumination of the reticle 7 becomes as homogeneous as possible. If use is made of a nested collector which provides two reflections in the interior as well, then the larger operating distance can be achieved even with constant far field illumination and a significantly smaller numerical aperture at the intermediate focus. This is explained below with reference to FIG. 8. Components corresponding to those which have been described above with reference to the figures already explained above bear the same reference numerals and will not be discussed in detail again.

Figure 8:
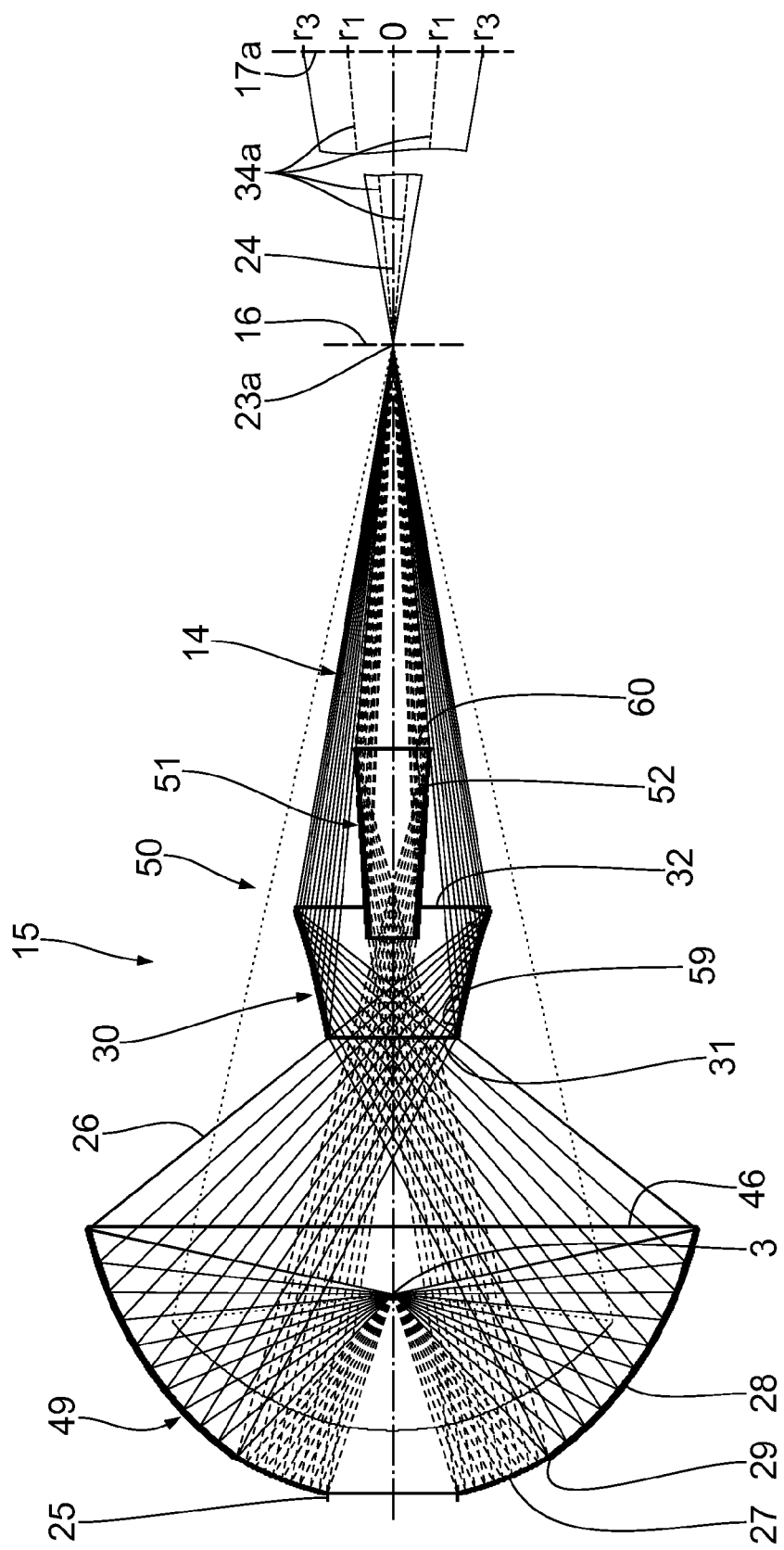

In contrast to the embodiment according to FIG. 7, the collector 15 according to FIG. 8 has a grazing mirror collector subunit 50 having a further truncated-cone-like mirror 51 besides the truncated-cone-like mirror 30. The further truncated-cone-like mirror 51 is arranged in the region of the exit-side through opening 32 of the truncated-cone-like mirror 30. The EUV radiation is reflected from an inner wall 52 of the truncated-cone-like mirror 51. A beam path of the EUV radiation once again emerges from the radiation source 3, is then reflected at the central collecting mirror section 27 of the normal mirror collector subunit 23, and from there in a grazing manner at the inner wall 52 of the truncated-cone-like mirror 51. By this means, once again it is possible to achieve qualitatively an intensity distribution in the illumination far field 17a as already explained above in connection with the collector 15 according to FIG. 7 and also in connection with FIG. 10. In particular, this embodiment of the collector succeeds in keeping the far field of the source module constant over the entire used range.

A ruthenium coating can be used as highly reflective coating for the mirrors of the grazing mirror collector subunits. If angles of incidence fall below 70°, the mirrors can be coated with two different layer types.

In particular, different mirror regions, for example mirror sections 27 and 28 of the collecting mirror 23, can be coated with different layer types or else with layer types having a changing layer thickness, in order to provide the greatest possible reflection of the EUV radiation 14 for the angles of incidence respectively present there. Examples of different layer types are given by WO 2012/126867 A1.

For the case where the collector is embodied in a nested fashion, then gaps in the far field 17a that occur for instance e.g. at the transitions between the different collector beam paths in the radius range between $r_0$ and $r_3$ (cf. FIG. 10) can be avoided by virtue of the fact that end regions—facing the intermediate focus in the intermediate focal plane 16—of the nested mirrors, for example of the mirror 30 in the embodiment according to FIG. 4 or of the mirrors 30 and 37 in the embodiment according to FIG. 5 or of the mirror 30 in the embodiment according to FIG. 6, run in a chamfered fashion or the light is slightly defocused in the intermediate focus in the intermediate focal plane 16.

If the transitions between different parts of the collector, e.g. in the transition regions 29 or 40, are not possible in a seamless fashion, then a gap can be left in the angular spectrum picked up at the expense of the transmission. However, the mirrors are then shaped such that the angular distribution at the output of the source module, that is to say of the radiation source 3, and in particular the illumination of the first facets of the illumination system have no gaps.

In a manner similar to that explained above in connection with FIGS. 10 and 10A, analogous differential equation systems for predefining the arrangement and design of the mirror subunits involved can also be derived for the geometries of the collectors explained above in connection with FIGS. 3 to 8. A few examples are also outlined below in this connection:

Importance has previously been attached exclusively to the desired intensity I(r). However, if the source emits highly anisotropic ally (large amount of structure in $Q(\vartheta)$) or the transmission varies greatly over the solid angle, that leads to a great variation of the imaging scale from plasma to intermediate focus. However, the intermediate focus is typically imaged onto small facets. For this purpose it is advantageous to generate a plasma image in the intermediate focus which is independent of the emission angle. This is achieved with the above approach by setting $T(\vartheta)$ and $Q(\vartheta)$ to be constant and choosing I(r) to be proportional to the cosine of the angle at the intermediate focus. It is also conceivable for the plasma not to be round, and for the imaging scale therefore to be varied in a targeted manner through a suitable choice of I(r).

In the variants having a plurality of nested collector shells, mirrors of finite thickness ensure that shadows occur in the target region. By slightly varying the position of the intermediate focus ($d=d_0+\Delta d(\vartheta)$) in the transition regions, it is possible to blur the shadows.

The method can also be extended to more than two reflections. However, additional boundary conditions are then needed in order to make the solution unique (i.e. further differential equations). These might be for example further intermediate foci or as in FIGS. 4 and 5 (in each case outer, dash-dotted or dashed part of the light cone, a boundary condition in respect of the angles of incidence. The latter are designed in the examples such that they are in each case identical on the two mirrors impinged on in a grazing fashion. That increases the transmission of this mirror combination.

Figure 9:
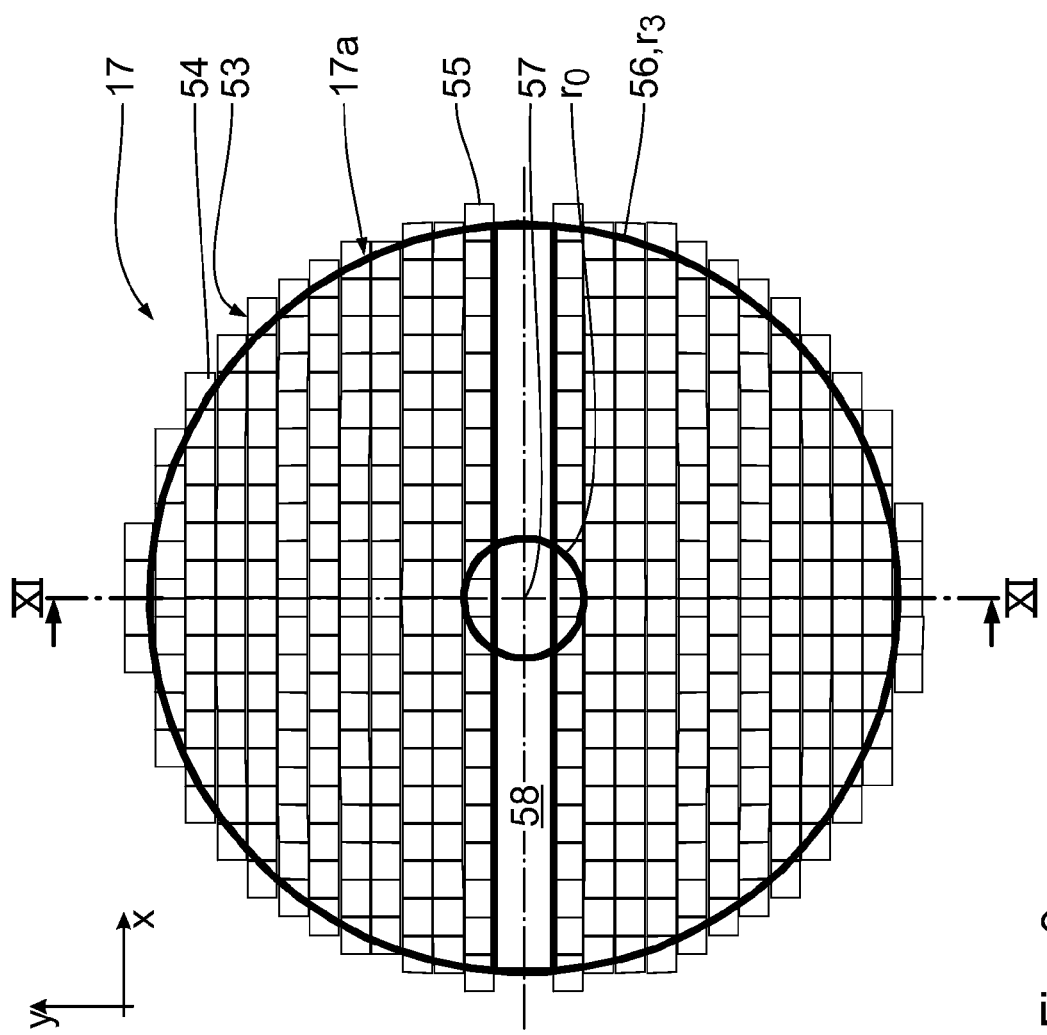
FIG. 9 shows a plan view of a field facet mirror of an illumination optical unit of the projection exposure apparatus according to FIG. 1.

FIG. 9 shows a plan view of the field facet mirror 17, on which the illumination far field 17a impinges. An overall reflection surface 53 of the field facet mirror 17 is subdivided into a plurality of facet modules 54. The latter can in turn be subdivided into facet mirrors or individual mirrors. Alternatively, each facet module 54 can constitute a single facet mirror. An outer contour 55 of the overall reflection surface 53 of the field facet mirror 17 completely includes an outer intensity region 56 of the far field. In other words, the outer contour 55 is always at least of the same size as the outer intensity region 56. The arrangement of the facet modules 54 therefore completely covers the illumination far field 17a illuminated by the collector 15.

The outer intensity region 56 of the far field 17a constitutes a full circle inscribed into the outer contour 55 of the overall reflection surface 53.

The outer intensity region 56 is that region of the intensity distribution I(r) of the far field 17a which is the furthest away from the center (r=0) of the far field 17a and in which at least 5% of a maximum intensity $I_{max}$ in the far field 17a arrives. In the schematic illustration according to FIGS. 9 and 10, the outer intensity region 56 lies at a radius value $r_3$.

FIG. 9 additionally depicts a local Cartesian xy coordinate system spanning the overall reflection surface 53 of the field facet mirror 17. The y-direction of the local coordinate system runs parallel to the y-direction of the coordinate system in FIG. 1.

In the range of small y-distances with respect to a central x-axis through a center 57 of the overall reflection surface 53, the far field 17a, in a manner governed by the construction, has a gap 58 in which no facet modules 54 are arranged either.

The facet mirror 17 according to FIG. 9 can be used with one of the above-described collector variants in the illumination optical unit 4 or in the illumination system 2.

A further embodiment of the illumination optical unit 4 in the illumination system 2 according to FIG. 1 is explained below with reference to FIG. 11. Components corresponding to those which have already been explained above bear the same reference numerals and will not be discussed again.

The collector 15 is merely indicated schematically in FIG. 11. This can involve one of the embodiments explained above. In the case of the illumination optical unit 4 according to FIG. 11, the pupil facet mirror 18 lies directly in an entrance pupil of the projection optical unit 9 disposed downstream of the object field 5. A transfer optical unit, as described above in connection with FIG. 1, can therefore be dispensed with. The object field 5 is illuminated with a numerical aperture of 0.162.

In the case of the illumination optical unit 4 according to FIG. 11, the intermediate focus in the intermediate focal plane 16 lies directly spatially alongside the pupil facet mirror 18. This results in a very narrowly folded illumination system 2, which is correspondingly spatially compact. The collectors 15 of the embodiments described are particularly suitable in this case since they have an advantageously small extent in the z-direction.

On each mirror within the respective beam path for the EUV radiation 14 in the various collector embodiments described, it is possible to mount an appropriate grating for suppressing different wavelength ranges in particular via Bragg reflection. In this case, an additional intermediate focus is useful, but not absolutely necessary.

Such gratings 59, 60 having different grating periods are indicated very highly schematically in FIG. 8 on the mirrors 30, 51.

Corresponding gratings 59, 60 are also indicated on the mirrors 36, 37 of the embodiment according to FIG. 4.

During the use of the projection exposure apparatus 1 with one of the collector variants described above, the reticle 7 and the wafer 12, which bears a coating that is light-sensitive to the illumination light 14, are provided and at least one section of the reticle 7 is subsequently projected onto the wafer 12 with the aid of the projection exposure apparatus 1. Finally, the light-sensitive layer exposed by the illumination light beam 14 on the wafer 12 is developed. The micro- or nanostructured component, for example a semiconductor chip, is produced in this way.

The invention claimed is:

1. A collector configured to transfer EUV radiation from an EUV radiation source into an illumination far field, the EUV collector comprising:
a normal incidence mirror collector subunit comprising a mirror for normal incidence and configured to transfer the EUV radiation from the radiation source to the illumination far field; and
a grazing incidence mirror collector subunit comprising a mirror for grazing incidence and configured to transfer the EUV radiation from the radiation source to the illumination far field,
wherein the collector subunits are arranged so that:
the collector subunits provide a total intensity distribution of the EUV radiation over the far field;
the total intensity distribution over the far field comprises, via different collector beam paths, a normal mirror incidence intensity distribution and a grazing incidence mirror intensity distribution;
the normal mirror incidence intensity distribution is generated via reflection at least at the normal incidence mirror collector subunit;
the grazing incidence mirror intensity distribution is generated by reflection at least at the grazing incidence mirror collector subunit;
at least over a section of the far field which is greater than 50% of the total far field, the total intensity distribution deviates by less than 20% from an average intensity in the section of the far field; and
the section of the far field is an area of the far field extending between different radii of the far field as measured proceeding from a center of the far field.

2. The collector of claim 1, wherein the collector subunits are arranged so that the normal incidence mirror intensity distribution merges continuously into the grazing incidence mirror intensity distribution.

3. The collector of claim 1, wherein the collector subunits arranged so that a number of reflections of the EUV radiation which generates the normal incidence mirror intensity distribution is different from a number of reflections of the EUV radiation which generates the grazing incidence mirror intensity distribution.

4. The collector of claim 1, wherein the collector is configured so that, during use of the collector, EUV radiation impinges on mirrors of one of the collector subunits both from the inside with respect to a central axis of the collector and from the outside with respect to the central axis of the collector.

5. The collector of claim 1, wherein at least one of the subunits comprises gratings having different grating periods.

6. The collector of claim 5, wherein different mirrors impinged on successively of at least one subunit comprise gratings having different grating periods.

7. The collector of claim 1, wherein different mirrors impinged on successively of at least one subunit comprise gratings having different grating periods.

8. The collector of claim 1, wherein at least over a section of the far field which is greater than 40% of the total far field, the total intensity distribution deviates by less than 15% from an average intensity in the section of the far field.

9. The collector of claim 1, wherein at least over a section of the far field which is greater than 40% of the total far field, the total intensity distribution deviates by less than 10% from an average intensity in the section of the far field.

10. The collector of claim 1, wherein at least over a section of the far field which is greater than 40% of the total far field, the total intensity distribution deviates by less than 5% from an average intensity in the section of the far field.

11. The collector of claim 1, wherein at least over a section of the far field which is greater than 45% of the total far field, the total intensity distribution deviates by less than 15% from an average intensity in the section of the far field.

12. The collector of claim 1, wherein at least over the section of the far field which is greater than 50% of the total far field, the total intensity distribution deviates by less than 15% from an average intensity in the section of the far field.

13. The collector of claim 1, wherein the total intensity distribution has a maximum value, and the maximum value of the total intensity distribution is located outside the section of the far field.

14. The collector of claim 13, wherein, within the section of the far field, the total intensity distribution is between 0.6 times the maximum value of the total intensity distribution and 0.8 times the maximum value of the total intensity distribution.

15. An illumination optical unit, comprising:
a collector according to claim 1; and
a facet mirror configured so that, during use of the illumination optical unit, the facet mirror guides EUV radiation that is collected by the collector.

16. The illumination optical unit of claim 15, wherein an outer contour of an overall reflection surface of the facet mirror is at least the same size as an outer intensity region of the illumination far field of the collector at the location of the facet mirror.

17. An illumination system, comprising:
an EUV radiation source; and
an illumination optical unit comprising a collector according to claim 1.

18. The illumination system of claim 17, wherein the illumination optical unit further comprises a facet mirror configured so that, during use of the illumination system, the facet mirror guides EUV radiation that is collected by the collector.

19. An apparatus, comprising:
an EUV radiation source;
an illumination optical unit comprising a collector according to claim 1; and
an imaging optical unit configured to image the object field into an image field.

20. A method of using an apparatus comprising an illumination optical unit and an imaging optical unit, the method comprising:
using the illumination optical unit to illuminate a reticle; and using the imaging optical unit to image at least a section of the illuminated reticle onto a light-sensitive material, wherein the illumination optical unit comprises a collector according to claim 1.

21. The collector of claim 1, further comprising a stop between the EUV radiation source and the mirror, wherein the stop is configured so that, during use of the collector unit, the stop blocks: a) radiation from the EUV radiation source; and/or b) particles from the EUV radiation source.

22. The collector of claim 1, wherein the collector sub-units are configured so that, during use of the collector unit, between the EUV radiation source and the illumination far field there is no light path where light is guided via only grazing incidence radiation.

23. The collector of claim 1, wherein the collector sub-units are configured so that, during use of the collector unit, between the EUV radiation source and the illumination far field all light paths undergo at least one normal incidence reflection.

24. The collector of claim 1, wherein the collector sub-units are configured so that, during use of the collector unit, normal incidence reflection light paths starting from the EUV radiation source do not run through a source volume of the EUV radiation source.

\* \* \* \* \*

UNITED STATES PATENT AND TRADEMARK OFFICE
CERTIFICATE OF CORRECTION

PATENT NO. : 9,754,695 B2  
APPLICATION NO. : 14/665279  
DATED : September 5, 2017  
INVENTOR(S) : Martin Endres Page 1 of 1

It is certified that error appears in the above-identified patent and that said Letters Patent is hereby corrected as shown below:

In the Specification

Column 7, Line 41, delete "α65°" and insert -- $\alpha \geq 65°$ --.
Column 15, Line 46, delete "anisotropic ally" and insert -- anisotropically --.

Signed and Sealed this
Twelfth Day of December, 2017

Joseph Matal
*Performing the Functions and Duties of the*
*Under Secretary of Commerce for Intellectual Property and*
*Director of the United States Patent and Trademark Office*